(12) United States Patent
Volatier et al.

(10) Patent No.: US 7,586,391 B2
(45) Date of Patent: Sep. 8, 2009

(54) SWITCHABLE FILTER WITH RESONATORS

(75) Inventors: Alexandre Volatier, Fontaine (FR); Pascal Ancey, Revel (FR); Bertrand Dubus, Ronchin (FR)

(73) Assignee: STMicroelectronics SA, Montrouge (FR)

(*) Notice: Subject to any disclaimer, the term of this patent is extended or adjusted under 35 U.S.C. 154(b) by 186 days.

(21) Appl. No.: 11/845,362

(22) Filed: Aug. 27, 2007

(65) Prior Publication Data
US 2008/0129416 A1 Jun. 5, 2008

(30) Foreign Application Priority Data
Aug. 28, 2006 (FR) .................................. 06 53487

(51) Int. Cl.
*H03H 9/54* (2006.01)
*H03H 9/70* (2006.01)
*H01L 41/083* (2006.01)
(52) U.S. Cl. .................................. 333/188; 333/189
(58) Field of Classification Search .................. 333/187, 333/188, 189, 190, 191
See application file for complete search history.

(56) References Cited

U.S. PATENT DOCUMENTS

| | | | | |
|---|---|---|---|---|
| 5,446,306 | A | 8/1995 | Stokes et al. ............... | 257/416 |
| 5,821,833 | A | 10/1998 | Lakin ......................... | 333/187 |
| 6,670,866 | B2 * | 12/2003 | Ella et al. .................... | 333/133 |
| 6,720,844 | B1 | 4/2004 | Lakin ......................... | 333/189 |
| 6,917,261 | B2 * | 7/2005 | Unterberger ............... | 333/189 |
| 7,391,285 | B2 * | 6/2008 | Larson et al. ............... | 333/189 |
| 7,391,286 | B2 * | 6/2008 | Jamneala et al. ........... | 333/189 |

FOREIGN PATENT DOCUMENTS

| | | |
|---|---|---|
| EP | 1126602 | 8/2001 |
| FR | 2863789 | 6/2005 |
| WO | WO02/087081 | 10/2002 |

OTHER PUBLICATIONS

"Coupled Bulk Acoustic Wave Resonator Filters: key Technology for Single-to-Balanced RF Filters", Fattinger et al., 2004 IEEE MTT-S Digest, pp. 927-929, 0-7803-8331-1/4.

\* cited by examiner

*Primary Examiner*—Dean O Takaoka
(74) *Attorney, Agent, or Firm*—Lisa K. Jorgenson; Allen, Dyer, Doppelt, Milbrath & Gilchrist, P.A.

(57) ABSTRACT

A switchable filter may include a first acoustic resonator including first electrodes, and a first resonant layer between the first electrodes and having electrostrictive material. The switchable filter may further include a second acoustic resonator including second electrodes, and a second resonant layer between the second electrodes and having electrostrictive material. The second acoustic resonator may be acoustically coupled with the first acoustic resonator. At least one of the first electrodes and at least one of the second electrodes may be arranged between the first resonant layer and the second resonant layer. The electrostrictive material may adjust a resonance and a filter switching of the first and second acoustic resonators as a function of a control voltage applied to terminals of the first and second acoustic resonators. Two electrodes from one of the first electrodes and the second electrodes may be filter input electrodes. Two electrodes from one of the first electrodes and the second electrodes may be filter output electrodes.

23 Claims, 5 Drawing Sheets

SWITCHABLE FILTER WITH RESONATORS

FIELD OF THE INVENTION

This invention relates to the field of filters, more particularly, filters made from resonators, used in multi-standard transmitter and/or receiver architectures.

BACKGROUND OF THE INVENTION

FIG. 1 shows an example of a multi-standard reception architecture. Firstly, an antenna 1 receives the signals. A switching stage 2, including several switches, directs the received signal to one of the appropriate pass-band filters 3a-3c to recover only the desired frequency signal at the output.

Switches used in the switching stage 2 may, for example, comprise transistors (for example, field effect transistors based on gallium arsenide), and PIN diodes. These switches have the advantage that they are easy to implement, but they may not be directly integrated. Accordingly, they may be transferred onto the circuit. Furthermore, they may introduce large power losses on the signal to be routed, particularly, at high frequencies, such as, frequencies used for wireless communications. These switches may comprise Micro Electro Mechanical Systems (MEMS). This type of switch has good isolation and contact properties, but the switching voltages used are usually high (>12V), and their production is complex. Furthermore, the size of these MEMS remains fairly large, for example, of the order of 500*500 µm².

Typically, the filters used in this type of architecture, such as, filters 3a-3c in FIG. 1, are Bulk Acoustic Wave (BAW) filters. These BAW filters are made by coupling piezoelectric resonators. A piezoelectric resonator comprises a resonant layer comprising piezoelectric material arranged between two electrodes.

BAW filters may have electrical coupling. The electrodes of the piezoelectric resonators are coupled electrically between themselves. Thus, the signal to be filtered is propagated from one resonator to another passing through electrical connections coupling the resonator electrodes between themselves. Coupling can be done in series and/or in parallel to obtain Ladder filters, or in lattice to obtain Lattice filters. BAW filters may also have acoustic coupling. The signal to be filtered then propagates from one resonant layer to another resonant layer directly or through an acoustic propagation medium. It may use Stacked Crystal Filters (SCF) and Coupled Resonator Filters (CRF).

An example of an SCF 4 is shown in FIG. 2. This filter 4 includes a substrate 5, on which a Bragg mirror 6 is stacked with an output electrode 7, a first piezoelectric resonant layer 8, a central electrode 9, a second piezoelectric resonant layer 10, and an input electrode 11. A ground 14 is connected to the central electrode 9, common to the two piezoelectric layers 8, 10. The output electrode 7, the central electrode 9, and the first piezoelectric layer 8 form a first piezoelectric resonator. While the input electrode 11, the central electrode 9, and the second piezoelectric layer 10 form a second piezoelectric resonator acoustically coupled with the first piezoelectric resonator. The input signal is applied between the input electrode 11 and the ground 14. The signal then propagates through the two piezoelectric layers 10, 8. The thickness of each piezoelectric layer may, for example, be equal to about a half wavelength $\lambda/2$. The signal recovered between the output electrode 7 and the ground 14 is actually the signal with the wavelength $\lambda$.

The Bragg mirror 6 comprises a stack of alternating layers with high and low acoustic impedance preventing propagation of this signal in the substrate 5, particularly, by reflecting signals with wavelength equal to $\lambda$. This filter 4 is used to obtain a narrow passband at the output (passband about 50 MHz where f=1.5 GHz). These SCF filters are sometimes made without a Bragg mirror, for example, directly on a membrane. But in this case, the output spectrum contains harmonics with a parasite wavelength equal to $\lambda/2$ and $3\lambda/2$. A filter similar to the one shown in FIG. 2 is disclosed in U.S. Pat. No. 5,821,833 to Lakin. The addition of the Bragg mirror 6 eliminates these parasite harmonics in the output spectrum that are then dissipated in the substrate 5.

But the major disadvantage of these filters is that they may not be used for impedance matching, for example, when an impedance of 50$\Omega$ is used at the input, and an impedance of 200$\Omega$ is used at the output. Additional passive components, such as, inductors and capacitors then have to be used, for which the quality factor is important and thus creating additional constraints, for example, cost and size. Furthermore, with this type of resonator, it may be impossible to carry out a "single" type line conversion, in other words, non-differential to a differential type line. Once again, additional passive components may have to be used with exactly the same constraints as those mentioned above.

An example CRF 15 according to prior art is shown in FIG. 3. The CRF 15 includes a substrate 5, a Bragg mirror 6, and two piezoelectric layers 8, 10, identical to those shown in FIG. 2. In this CRF 15, each of the piezoelectric layers 8, 10 is arranged between two electrodes, 17a, 17b and 18a, 18b respectively. Thus, the piezoelectric layer 8 and the electrodes 17a and 17b form a first piezoelectric resonator, and the piezoelectric layer 10 and the electrodes 18a and 18b form a second piezoelectric resonator. Several acoustic coupling layers 16 are arranged between the two electrodes 17a, 18b themselves arranged between the two piezoelectric layers 8, 10, thus coupling the two piezoelectric resonators.

This CRF 15 operates in a differential mode. The input signal is applied between the two electrodes 18a, 18b in the second piezoelectric layer 10 and passes through the acoustic coupling layers 16. The output signal is recovered differentially between the two electrodes 17a, 17b in the first piezoelectric layer 8. The CRF 15 can create a wider passband at the output than the SCF 4, and the input can be electrically decoupled from the output. By modifying the number of acoustic coupling layers 16 and the nature of these layers, it is possible to modify the acoustic coupling so as to optimize the passband recovered at the output. With this type of filter, it is also possible to achieve impedance matching, for example, to change from 50$\Omega$ at the input to 200$\Omega$ at the output, as described in document "Coupled Bulk Acoustic Wave Resonator Filters: Key Technology for single-to-balanced RF filters" by Fattinger et al., IEEE MTT-S Digest 2004, pages 927 to 929. However, the passband obtained with this type of filter is wider than the passband obtained with an SCF (Passband about 70 MHz where f=1.5 GHz). Such a filter is disclosed in U.S. Pat. No. 6,720,844 to Lakin.

FIG. 4 shows another example filter 19. This filter 19 is made by putting two CRFs 15a, 15b into series, for example, identical to the CRF 15 in FIG. 3. Two piezoelectric resonators 26a, 26b, belonging to the first CRF 15a and the second CRF 15b respectively, each including a piezoelectric layer 20a, 20b, respectively, are arranged on the acoustic coupling layers 16 common to the two CRFs 15a, 15b. The first resonator 26a includes two electrodes 21a, 21b through which an input signal is introduced. The second resonator 26b includes two electrodes 22a, 22b through which the output signal is recovered from the filter 19. The electrodes 21a, 21b, 22a, 22b of the two resonators are not connected together.

A third and a fourth piezoelectric resonator 27a, 27b belong to the first CRF 15a and the second CRF 15b, respectively. Each piezoelectric resonator includes a piezoelectric layer 23a, 23b, respectively, for which the electrodes 24a, 24b and 25a, 25b are connected to each other in pairs. Thus, the signal propagates in the first resonator 26a, then in the acoustic coupling layers 16, the third resonator 27a, the fourth resonator 27b, and then leaves through the second resonator 26b. This filter 19 may give a better selectivity for filtering than the CRF 15 in FIG. 3.

SUMMARY OF THE INVENTION

The object of this invention is to use a single device to perform filtering and switching functions while maintaining a sufficient and finely adjustable passband.

A switchable filter is provided and includes at least one first acoustic resonator including at least one first resonant layer arranged between at least two first electrodes, and at least one second acoustic resonator including at least one second resonant layer arranged between at least two second electrodes. The second acoustic resonator is acoustically coupled with the first acoustic resonator. One of the first electrodes and one of the second electrodes are arranged between the first resonant layer and the second resonant layer. The first and/or second resonant layers comprise electrostrictive material for adjustment of the resonance of the resonators including the electrostrictive material and filter switching as a function of a control voltage applied to the terminals of the resonators including the electrostrictive material. Two electrodes of one of the filter resonators may be filter input electrodes, and two electrodes of the other filter resonator may be filter output electrodes.

A continuous control voltage applied between the electrodes of the electrostrictive resonators can be used to adjust the resonance of the resonators, which is zero when the control voltage is zero. Thus, by coupling a first piezoelectric and/or electrostrictive resonator and a second piezoelectric and/or electrostrictive resonator, the filtering and switching functions are provided by a single device using the electrostrictive layer for which the resonance is adjustable using a DC voltage applied to its terminals. This may result in a reduction in the size used to integrate these two functions into a transmitter and/or receiver architecture.

Furthermore, this combination of these two functions can reduce internal losses created in a communication device, for example, between an antenna and an information processing unit. Finally, technological production of filtering and switching functions is also simplified due to implementation of these two functions by a single device.

A switchable filter may include at least one first acoustic resonator including a resonant layer arranged between two electrodes, and at least one second acoustic resonator arranged above or below the first resonator and acoustically coupled with the first resonator. The second resonator includes at least one layer comprising electrostrictive material arranged between two electrodes. The switchable filter may also include acoustic isolation means or an acoustic isolator. One of the two resonators may be arranged between the other of the two resonators and the acoustic isolator. The acoustic isolator eliminates the unused parasite harmonics from the output spectrum.

The switchable filter may also include a substrate. The acoustic isolator is arranged between the substrate and one of the two resonators. In this case, the acoustic isolator may be an acoustic reflector, such as, a Bragg mirror or an air cavity. The acoustic isolator may also comprise an air cavity formed in a substrate. The switchable filter may also include a plurality of acoustic coupling layers arranged between the two acoustic resonators and acoustically coupling the two acoustic resonators. These acoustic coupling layers are used to electrically isolate the filter resonators, particularly, in the case of a differential input and/or output.

The switchable filter may include at least a third acoustic resonator including at least a third resonant layer arranged between at least two third electrodes. The third acoustic resonator is acoustically coupled with the first and second acoustic resonators. One of the three acoustic resonators is arranged between the other two acoustic resonators.

Thus, a filter may include one or several piezoelectric resonators and one or several electrostrictive resonators. This type of filter may increase the number of resonance poles, and therefore, an increase in the selectivity of the filter for exactly the same size as a filter including only two resonators. With such a filter, it is possible to decouple a DC control voltage applied to the electrostrictive layers from the RF signal to be filtered, which reduces parasite harmonics that may be present on the output spectrum. Furthermore, such a filter may reduce the difficulty of adjusting the input and output impedances as a function of the chosen resonant materials. The third resonant layer may comprise an electrostrictive material.

The third acoustic resonator may be acoustically coupled with at least one of the first or second acoustic resonators by acoustic coupling layers arranged between the third acoustic resonator and the one of first or second acoustic resonators. The electrodes in the third resonator may be electrically isolated from the electrodes in one of the other two acoustic resonators.

The switchable filter may include at least one third acoustic resonator including at least one third resonant layer arranged between at least two third electrodes, and at least one fourth acoustic resonator including at least one fourth resonant layer arranged between at least two fourth electrodes. The fourth acoustic resonator is acoustically coupled with the third acoustic resonator. One of the third and one of the fourth electrodes is arranged between the third resonant layer and the fourth resonant layer. The third or fourth electrodes are electrically connected to the first or second electrodes.

Thus, two filters can be put in series, each filter including two resonators. The selectivity of the filter made may be increased. It is also possible to decouple a DC control voltage applied to the electrostrictive layers from the RF signal to be filtered, which reduces parasite harmonics that may be present on the output spectrum. The input and output impedances may also easily be adjusted as a function of the chosen resonant materials. The third acoustic resonator may be acoustically coupled with the fourth acoustic resonator through acoustic coupling layers arranged between the third and the fourth acoustic resonators, electrically isolating the third and fourth acoustic resonators. The third and/or fourth resonant layer may comprise an electrostrictive material.

The electrodes in one of the acoustic resonators may comprise two differential input electrodes, and the electrodes of the other acoustic resonator may be two differential output electrodes. The filter input electrodes may be differential input electrodes, and the filter output electrodes may be differential output electrodes. At least one filter input or output electrode may be connected to a reference potential forming an input or output electrode of a non-differential type filter.

At least one electrode of an acoustic resonator may be connected to a reference potential forming an input or output electrode of a non-differential type filter. A signal transmitter and/or receiver device may include at least one antenna connected to at least one switchable filter as described above. The signal transmitter and/or receiver device may also include at least one impedance matching network arranged between the switchable filter and the antenna. The signal transmitter and/or receiver device may be designed to implement at least one communication according to one of the type 2G, 2.5G, 3G, or more recent mobile telephony standards.

BRIEF DESCRIPTION OF THE DRAWINGS

This invention may be better understood after reading the description of example embodiments given purely for explanatory purposes and in no way restrictive with reference to the appended drawings in which.

DETAILED DESCRIPTION OF THE PREFERRED EMBODIMENTS

Identical, similar or equivalent parts in the different figures described below are marked with the same numeric references so as to facilitate comparison between one figure and the next. The different parts shown in the figures are not necessarily at the same scale, to make the figures more easily readable. The various possibilities (variants and embodiments) may be understood as not being exclusive of each other, and can be combined with each other.

Figure 5:
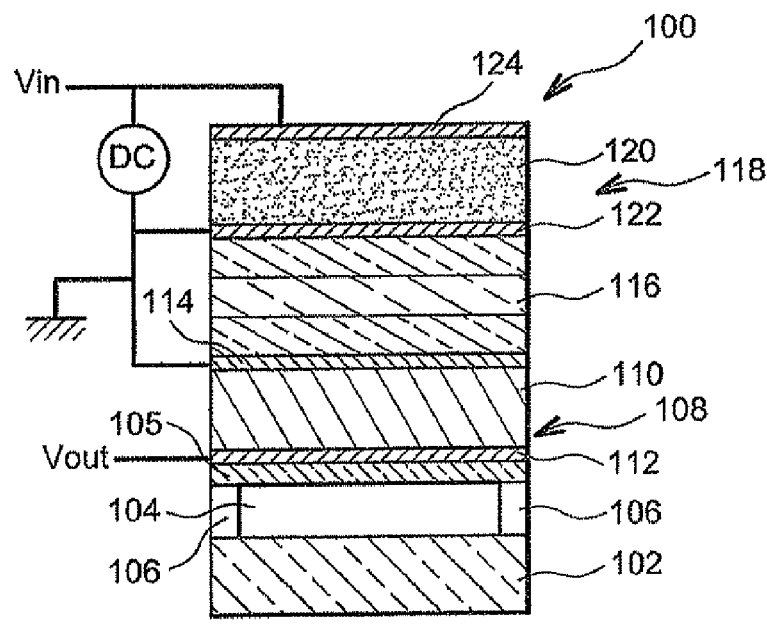
FIG. 5 shows a switchable filter according to a first embodiment of the present invention.

Firstly, referring to FIG. 5, a switchable filter 100 according to a first embodiment is depicted. The switchable filter 100 includes a substrate 102 that may comprise a semi-conductive material, such as, silicon, for example, similar to substrate 5 according to prior art. An air cavity 104 is formed by an etched sacrificial layer 106 formed on the substrate 102 and covered by a membrane 105. This air cavity 104 may, for example, be made by "surface micromachining", by etching the sacrificial layer 106 after making all elements of the filter 100 on the membrane 105.

A first resonator 108 is arranged on the air cavity 104. This first resonator 108 includes a resonant layer 110 arranged between two electrodes 112, 114. The resonant layer 110 may, for example, be made based on a piezoelectric material, such as, aluminium nitride and/or zinc oxide and/or PZT, and is supported on the membrane 105.

Figure 1:
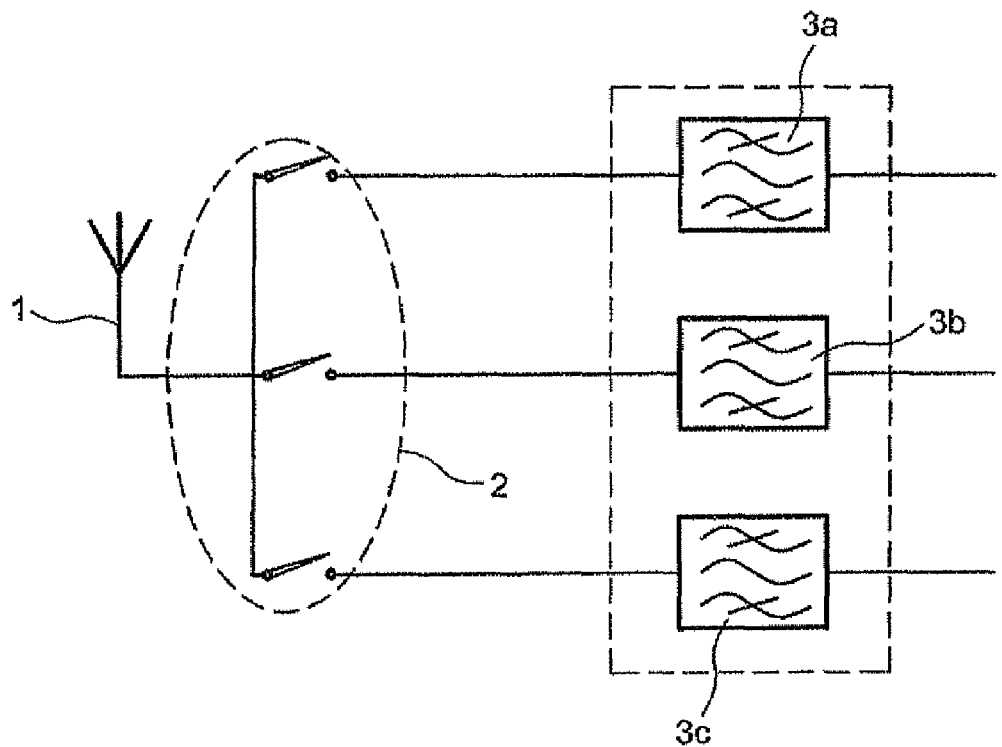
FIG. 1 shows a multi-standard reception architecture according to prior art.
Figure 2:
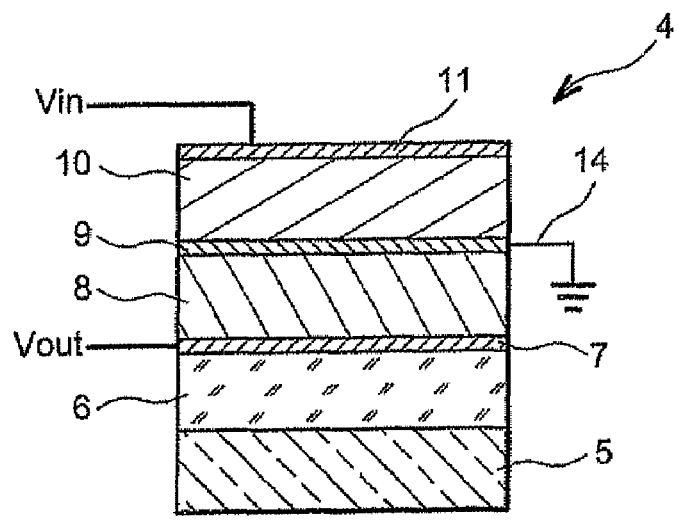
FIG. 2 shows a SCF according to prior art.
Figure 3:
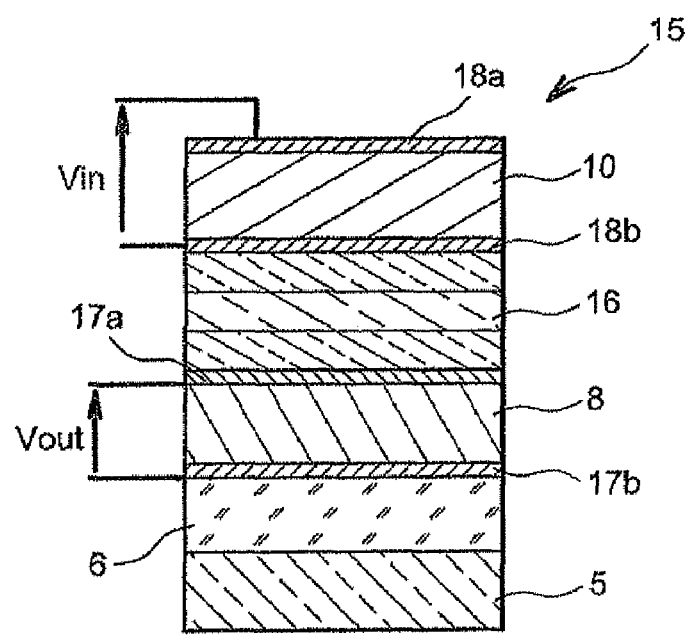
FIG. 3 shows a CRF according to prior art.

Acoustic coupling layers 116, for example, similar to the acoustic coupling layers 16 in FIG. 3, are arranged on the first resonator 108. These acoustic coupling layers 116 form an alternating stack of layers with a low acoustic impedance (for example, based on silicon oxide and/or silicon oxicarbide) and layers with a high acoustic impedance (for example, based on tungsten and/or silicon nitride and/or aluminium nitride and/or molybdenum).

Finally, a second resonator 118, including a resonant layer 120 arranged between two electrodes 122 and 124, is placed on the acoustic coupling layers 116. The resonant layer 120 may, for example, be an electrostrictive layer, in other words, made based on a material sensitive to electrostriction. This material may, for example, comprise strontium and barium titanate, and/or strontium titanate, and/or Rochelle salt, and/or PMN-PT, and/or PST-PT, and/or PSN-PT, and/or PZN-PT, and/or electrostrictive polymers. The electrodes 112, 114, 122 and 124 may, for example, comprise platinum, and/or aluminium, and/or molybdenum, and/or tungsten, and/or ruthenium.

A DC control voltage is applied on the electrostrictive layer 120 through electrodes 122, 124. This control voltage biases the electrostrictive material 120 and modulates the resonance of the electrostrictive material 120 compared with an input signal Vin applied on the electrode 124. In this case, the input is of the "single" type, in other words, it is not differential. The electrode 122 and the electrode 114 are connected to a reference potential, for example, a ground. The input signal Vin is the signal that may be filtered by the filter 100. If the control voltage is zero, the electrostrictive material is not deformed and in this case there is no resonance of the electrostrictive material 120. The input signal Vin is then not transmitted by the filter 100, and therefore no signal is recovered on the electrode 112 of the first resonator 108.

The output from filter 100 is also of the "single" type. A soon as a non-zero voltage is applied to the terminals of the electrostrictive layer 120, the material of the electrostrictive layer 120 may start resonance. This control voltage depends on the electrostrictive material used, and may, for example, be between about 2 and 20 V. The filter 100 then filters the signal Vin. The filtered signal Vin is recovered in output on the electrode 112 of the first resonator 108.

The input signal Vin is applied non-differentially to the electrode 124 of the second resonator 118. If a non-zero control voltage is applied to the terminals of the second resonator 118, the resonator 118 makes an electrical/acoustic conversion of the input signal Vin and filtering is done by this second resonator 118 that only resonates in a certain frequency band. This frequency bands depends on the thickness of the layer 120, the electrostrictive material used, and the thickness of the electrodes 122 and 124. For example, it may be chosen that the thickness of the electrostrictive layer 120, for example, made of PMN-PT, is about 500 nm, and the thickness of the electrostrictive layer of the electrodes 122 and 124, for example, made of platinum, are each equal to about 150 nm, thus enabling the second resonator 118 to have resonance in the fundamental mode of the input signal Vin at the central frequency of the used frequency band, for example, equal to about 2 GHz.

The second resonator 118 is acoustically coupled to the first resonator 108 through acoustic coupling layers 116. The resonance of the second resonator 118 then propagates through the acoustic coupling layers 116 to reach the first resonator 108. The first resonator 108 only resonates in a certain frequency band, thus contributing to filtering done by the filter 100. This resonance of the first resonator 108 is characterized by the piezoelectric material of the resonant layer 110 and by the thickness of the resonant layer 110 and the electrodes 112 and 114. The total thickness of the electrodes 112 and 114 and the piezoelectric layer 110 may, for example, be equal to half the wavelength of the central frequency of the used frequency band. For example, for a central frequency equal to about 2 GHz, the thickness of a piezoelectric layer 110 based on aluminium nitride is about 1.5 µm, and the thickness of an electrode comprising molybdenum is about 200 nm. The output signal is recovered on the electrode 112, the second resonator making an acoustic/electrical conversion of the resonance of the layer 110.

In the example shown in FIG. 5, where the material of the resonant layer 120 is an electrostrictive material, and the material of the resonant layer 110 is a piezoelectric material, the two resonators 110 and 120 preferably have a high quality factor (for example, more than 200) thus reducing insertion losses of the filter 100. The input or output impedance of a resonator is inversely proportional to the dielectric capacity of the material in the resonant layer of the resonator and the angular frequency corresponding to the central frequency of the filter. The dielectric capacity of the material is itself proportional to the dielectric constant of the material.

The dielectric constant of the piezoelectric material is usually lower than the dielectric constant of an electrostrictive material (for example, by a factor 100 between aluminium nitride and PMNT). Therefore, the surface of resonant layers is adapted so as to obtain the applicable input and output impedances on the filter 100, the capacitance of the resonator being proportional to the surface area of the resonant layers. The material of the electrostrictive layer could also be chosen as a function of the dielectric constant of this material, so as to obtain the used input and output impedances.

The signal does not propagate in the substrate 102 as a result of the air cavity 104 that forms acoustic isolation. Thus, with the filter 100 shown in FIG. 5, according to this embodiment, the filtering and switching functions are both made on a single device. Switching is done depending on whether or not there is a non-zero control voltage at the terminals of the electrostrictive resonator 118. When the control voltage is zero at the terminals of the electrodes 122 and 124, the resonator 118 is in the "OFF" state. In this "OFF" state, the electrostrictive resonator 118 is equivalent to a capacitance and therefore does not make any electrical/acoustic conversion when an electrical signal is applied to it at the terminals of electrodes 122 and 124.

The filter 100 is then equivalent to an open switch and therefore, the signal at the terminals of the electrodes 112 and 114 of the first resonator 108 is zero. When the control voltage is not zero, filtering is done by resonance in certain frequency bands of the resonators 108 and 118. As the applied control voltage increases, the resonance of the electrostrictive resonator 118 also increases.

Figure 4:
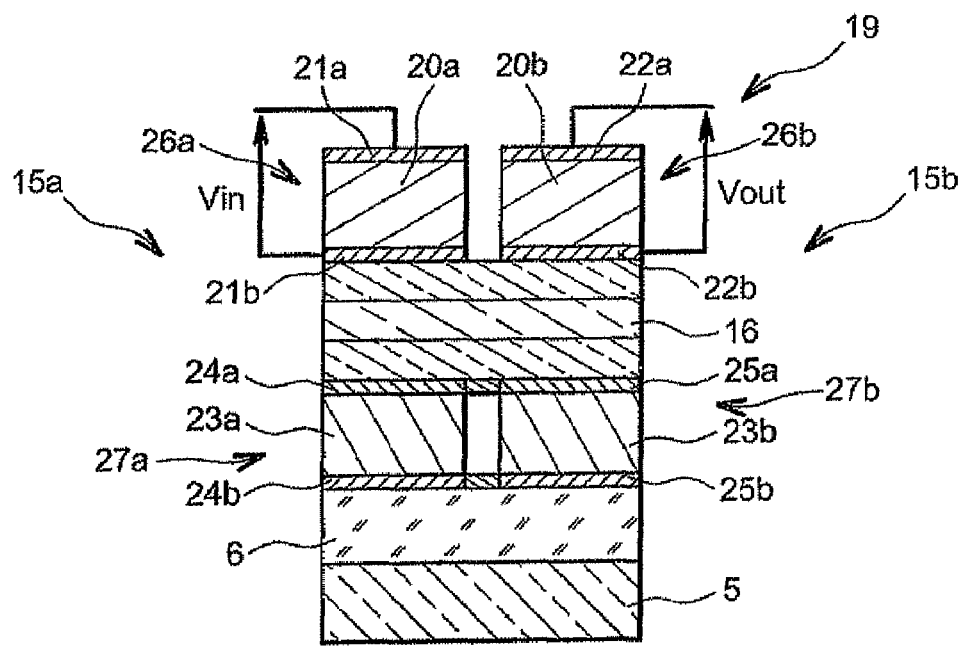
FIG. 4 shows an example filter according to prior art.

This first embodiment can result in a selectivity equivalent to that obtained by the CRF 19 in FIG. 4 (for example, a passband between 50 and 70 MHz where f=2 GHz). A difference in capacitance between the two resonators 108 and 118 can also be used to achieve impedance matching, for example, between an antenna with an output impedance of 50Ω and a circuit with an input impedance of about 200Ω. The appropriate dielectric constant/thickness ratios are chosen for the resonators so as to obtain the used impedance conversion, the ratio $$\frac{\varepsilon_{118}/e_{118}}{\varepsilon_{108}/e_{108}}$$

being proportional to the ratio $Z_{108}/Z_{118}$, where $\varepsilon$ is the dielectric constant, e the thickness and Z is the impedance for each of the resonators.

Thus, the filtering done may be configured by the thickness and type of material in the piezoelectric layer 110, the nature, thickness and number of acoustic coupling layers 116, the thickness and type of material in the electrostrictive layer 120, the thickness of the electrodes 112, 114, 122 and 124, and the control voltage applied to the terminals of the electrostrictive resonator 118.

Figure 6:
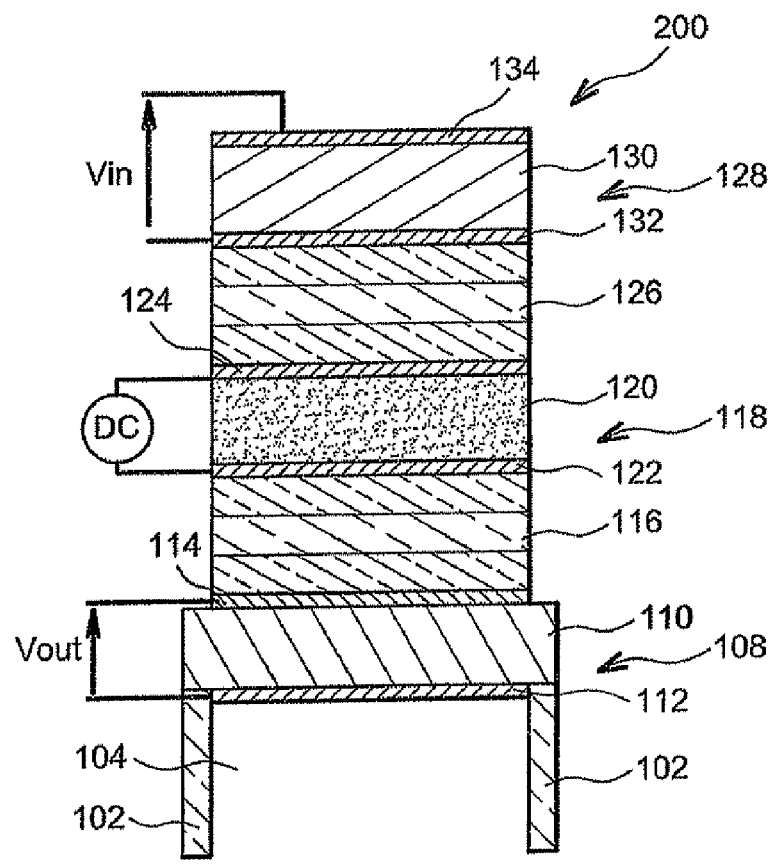
FIG. 6 shows a switchable filter according to a second embodiment of the present invention.

We may now refer to FIG. 6, which shows a switchable filter 200 according to a second embodiment. Compared with the switchable filter 100 shown in FIG. 5, this switchable filter 200 includes an air cavity 104 formed directly in the substrate 102. This air cavity 104 is made by directly etching the substrate 102 (bulk micromachining) thus forming the air cavity 104.

As for the first embodiment, the filter 200 in FIG. 6 includes a first and a second resonator 108 and 118, for example, similar to those shown in FIG. 5. These two resonators 108 and 118 are acoustically coupled by acoustic coupling layers 116 similar to those in FIG. 5. Furthermore, the switchable filter 200 includes acoustic coupling layers 126, for example, similar to the acoustic coupling layers 116 arranged on the second resonator 118 and a third resonator 128 arranged on the acoustic coupling layers 126. This resonator includes a resonant layer 1301 for example, a piezoelectric layer arranged between two electrodes 132 and 134, for example, similar to the electrodes 112 and 114.

Therefore, all three resonators 108, 118 and 128 are acoustically coupled. Unlike the filter 100 in FIG. 5, the input voltage Vin is applied to the terminals of the electrodes 132 and 134 of the third filter 128. Operation of the filter 200 is substantially the same as operation of the filter 100 in FIG. 5. A DC voltage is applied to the terminals of the second electrostrictive resonator 118 allowing the filter 200 to perform a switching function, in addition to filtering the applied voltage Vin.

Therefore in this second embodiment, three resonators are acoustically coupled to each other to make the switchable filter 200. However, it is possible to make a switchable filter with more than three resonators. In the example in FIG. 6, considering that the layers 110 and 130 are made based on the same material, the input impedance of the filter 200 is substantially equal to the output impedance of the filter 200 when the thicknesses of the resonators 128 and 108 are substantially equal.

Furthermore, in the example in FIG. 6, the DC control voltage applied to the terminals of the electrostrictive resonator 118 is decoupled from the input and output of the filter 200, in other words, decoupled from the RF signal to be filtered, with the result that very few parasites are obtained at the output from the filter 200.

Figure 7:
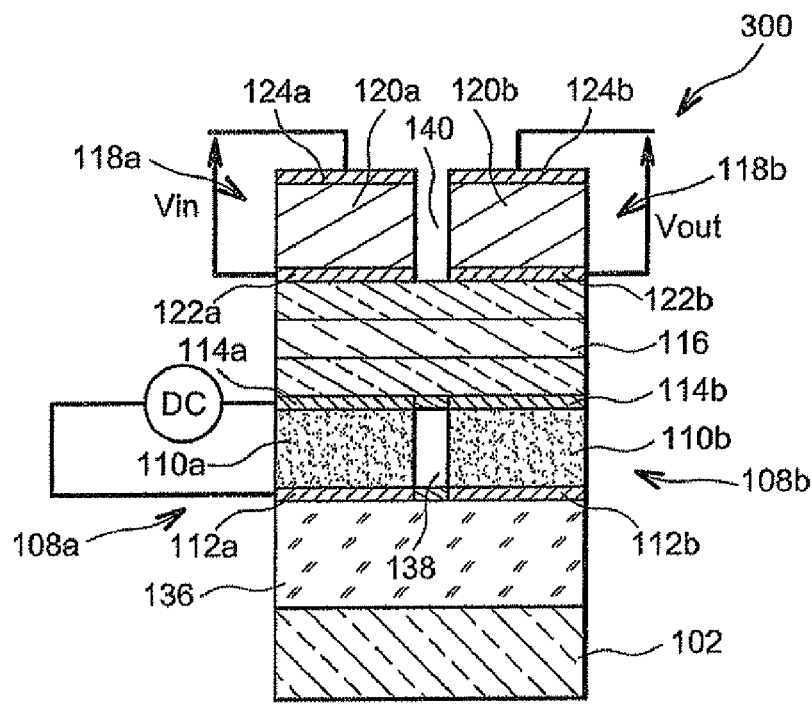
FIG. 7 shows a switchable filter according to a third embodiment of the present invention.

FIG. 7 shows a filter 300 according to a third embodiment. Like the switchable filter 100 in FIG. 5, the switchable filter 300 includes a substrate 102 that can comprise a semi-conducting material, such as, silicon. A Bragg mirror 136, for example, similar to the Bragg mirror 6 according to prior art, is placed on the substrate 102. This Bragg mirror 136 includes a stack of alternating layers with high and low acoustic impedance. The materials used to make this Bragg mirror 136 may, for example, comprise silicon oxide and/or tungsten, and/or silicon oxicarbide, and/or tantalum anhydride, and/or silicon nitride, and/or molybdenum, and/or aluminium nitride, and/or any dielectric or metal with a high quality coefficient.

Two electrostrictive resonators 108a, 108b, each including a resonant layer 103a, 103b based on a material sensitive to electrostriction arranged between a lower electrode 112a, 112b and upper electrode 114a, 114b, are placed adjacent to each other above the Bragg mirror 136. In the example in FIG. 7, the two electrostrictive resonators 112a, 112b are not stuck to each other, there is a space 138 between the two resonators 108a, 108b. It is also possible that the two electrostrictive resonators 112a, 112b are stuck to each other. For example, the material from which the electrostrictive layers 110a and 110b are made may be similar to the material used in the electrostrictive layer 120 in FIG. 5. The two lower electrodes 112a and 112b are electrically connected to each other, in the same way as the upper electrodes 114a and 114b. Acoustic coupling layers 116, for example, with a nature similar to the acoustic coupling layers 116 in FIG. 5 but with larger dimensions are arranged above the upper electrodes 114a, 114b.

Finally, two piezoelectric resonators 118a, 118b, each including a layer of piezoelectric material 120a, 120b arranged between a lower electrode 122a, 122b and an upper electrode 124a, 124b, are arranged adjacent to each other, above acoustic coupling layers 116. When the two piezoelectric resonators 118a, 118b are not stuck to each other, there may be a space 140 between the two resonators 118a, 118b. The material used for the piezoelectric layers 120a, 120b may, for example, be similar to the material used for the piezoelectric layer 110 in FIG. 5. The electrodes used in the filter 300 may, for example, be made based on a material similar to the material used for the electrodes in the filter 100 in FIG. 5.

An input signal Vin, in other words, the signal to be filtered, is applied differentially to the terminals of electrodes 122a, 124a of the piezoelectric resonator 118a. A first filtering is made by this first piezoelectric resonator 118a that only resonates in a certain frequency band. This frequency band depends on the thickness of the layer 120a, of the piezoelectric material(s) used, and the thickness of the electrodes 122a and 124a. For example, it might be chosen that the thickness of the piezoelectric resonator 118a is equal to the thickness of the piezoelectric resonator 108 in FIG. 5.

Since the piezoelectric resonator 118a is acoustically coupled to the electrostrictive resonator 108a through acoustic coupling layers 116, resonance of the piezoelectric resonator 138a then propagates through the acoustic coupling layers 116 and in the electrostrictive resonator 108a. A DC control voltage is applied on the electrostrictive layer 110a through electrodes 112a, 114a. The value of this control voltage depends on the electrostrictive material of the layer 110a, and, for example, may be between about 2V and 20V. This control voltage biases the electrostrictive material 110a and modulates the resonance of the material compared with the signal originating from the coupling layers 116.

If the control voltage is zero, the electrostrictive material does not deform and there is no resonance. Therefore the acoustic signal generated by the piezoelectric resonator 118a is not transmitted. As soon as a non-zero voltage is applied, the material in the electrostrictive layer 110a resonates, which filters the input signal based on a principle similar to that used in acoustic coupling filters according to prior art. Since electrodes 112a and 114a of the electrostrictive resonator 108a are connected to electrodes 112b, 114b of the electrostrictive resonator 108b, the signal then propagates in the electrostrictive resonator 108b due to electrical coupling of the electrodes.

Since the electrodes 112a, 112b and 114a, 114b are connected, the control voltage applied to the electrostrictive resonator 108a is also applied to the electrostrictive resonator 108b. The signal does not propagate in the substrate 102 due to the Bragg mirror 136 that acoustically reflects the signal propagating in the electrostrictive resonators 108a and 108b. Since the piezoelectric resonator 118b is acoustically coupled to the electrostrictive resonator 108b through acoustic coupling layers 116, the acoustic signal generated by the electrostrictive resonator 108b then propagates through the acoustic coupling layers 116 to end up in the piezoelectric resonator 118b. The signal thus filtered is recovered differentially at the terminals of the electrodes 122b, 124b of the piezoelectric resonator 118b.

Once again, with the filter 300 according to this invention shown in FIG. 7, the filter and switching functions are done on a single device, the switching being done depending on whether or not there is a non-zero control voltage is applied to the terminals of the electrostrictive resonators 108a, 108b. This filter 300 may be seen as putting two switchable filters in series, for example, two filters 100 according to the first embodiment, by the connection of electrodes 112a, 112b and 114a, 114b.

Compared with the filter 100 in FIG. 5, this filter 300 improves the selectivity of filtering. Furthermore, like the filter 200 in FIG. 6, this filter 300 results in an input and output impedance substantially similar if the characteristics of the piezoelectric resonators 118a and 118b are substantially similar, and a DC control voltage decoupled from the input signal to be filtered and the filtered output signal.

Figure 8:
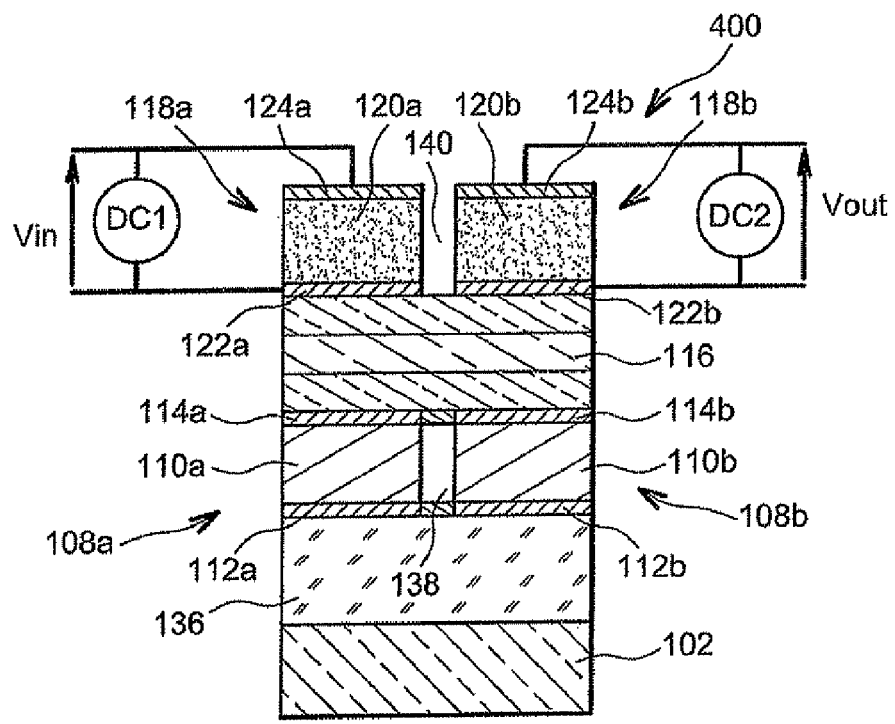
FIG. 8 shows a switchable filter according to a fourth embodiment of the present invention.

Referring now to FIG. 8, which shows a resonator filter 400 according to a fourth embodiment. Compared with the filter 300 in FIG. 7, the piezoelectric/electrostrictive properties are inverted between the filters 108a, 118a and the filters 108b, 118b. The input signal is applied to the terminals of the electrostrictive resonator 118a and is recovered after filtering at the terminals of the electrostrictive resonator 118b.

Operation of the filter 400 in FIG. 8 is identical to operation of the filter 300 in FIG. 7. Therefore, since the electrodes of the electrostrictive filters 118a, 118b are not connected to each other, two control voltages DC1 and DC2 are applied to the filter 400, one on each of the electrostrictive resonators 118a, 118b. These two control voltages may be identical or may be different, depending on the used filtering parameters. Compared with the filter 300 in FIG. 7, this fourth embodiment facilitates access to the electrodes of electrostrictive resonators to apply DC control voltages, these electrodes being located on the surface of the filter. There is no need to etch the filter to access the terminals of the electrostrictive resonators.

Figure 9:
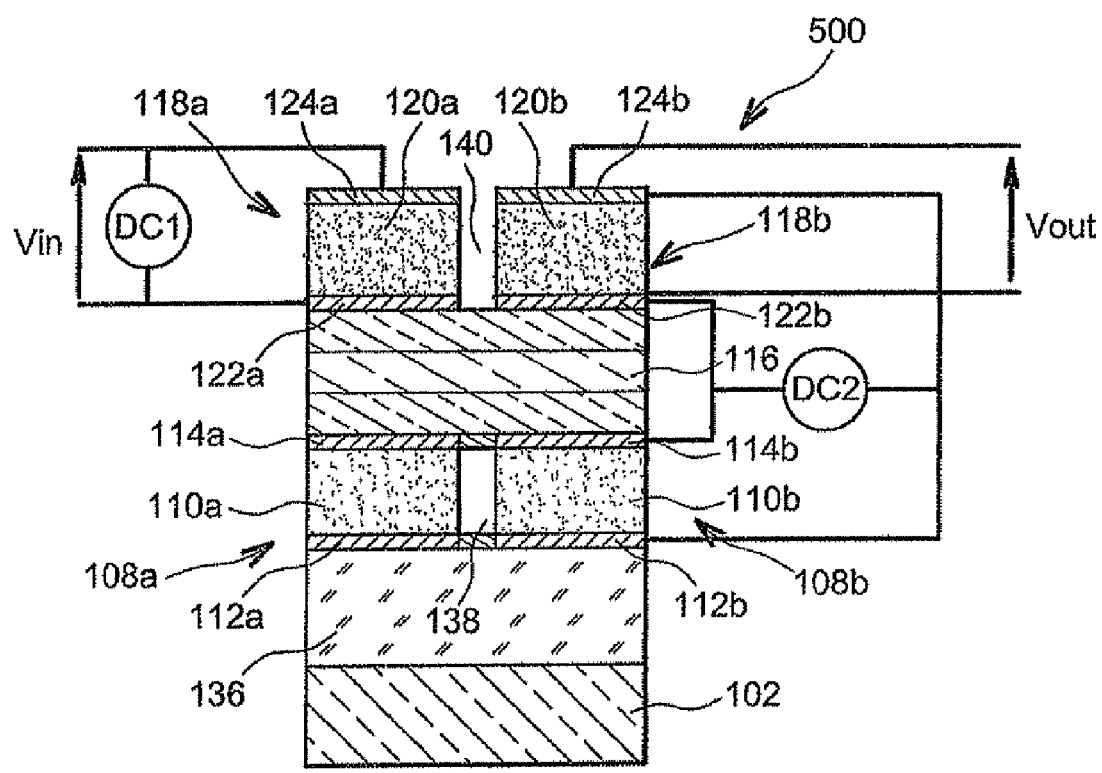
FIG. 9 shows a switchable filter according to a fifth embodiment of the present invention.

Referring now to FIG. 9, which shows a switchable resonator filter 500 according to a fifth embodiment. Compared with the filter 400 in FIG. 8, the resonant layers 110a and 110b of the two resonators 108a and 108b are not made based on a piezoelectric material, but are based on an electrostrictive material. Thus, the switchable filter 500 in FIG. 9 includes four electrostrictive resonators 108a, 108b, 118a and 118b. Operation of this filter is identical to operation of the filters shown in FIGS. 7 and 8. However, a control voltage is applied to each of the four resonators of the filter 800. In FIG. 9, a first DC control voltage DC1 is applied to the resonator 118a. A second DC control voltage DC2 is applied to the resonators 108b and 118b. Considering that electrodes 112a, 112b and 114a, 114b of the resonators 108a and 108b are connected to each other, the second control voltage DC2 is also applied to the electrodes 112a, 114a of the resonator 108a. In order to recover the output signal, the DC control voltage DC2 present at the terminals of the electrostrictive resonator 118b, is filtered.

Compared with the previous embodiments, the resonator filter according to this fifth embodiment enables better adjustment of the passband, for example, an adjustment of about an extra 15% plus or minus of a passband between 50 and 70 MHz where f=2 GHz. It is also possible to apply a third control voltage to the electrostrictive resonator 118b instead of the second control voltage DC2, the third control voltage being different from the first two control voltages DC1 and DC2.

Figure 10:
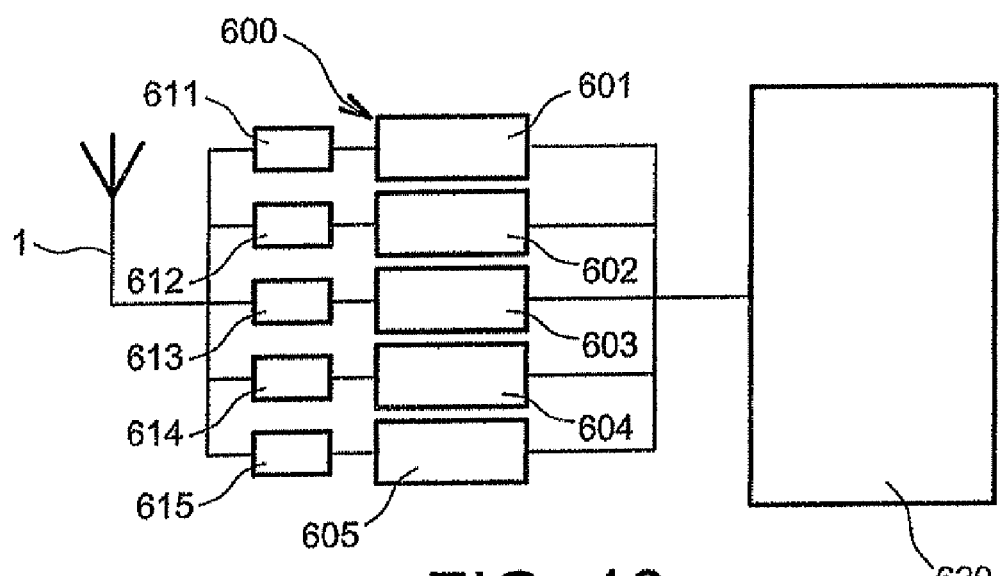
FIG. 10 shows an transmitter and/or receiver device according to the present invention.

The switchable filter according to these embodiments can be used in a multi-standard transmitter and/or receiver device. One example of a reception device 600 including switchable filters is shown in FIG. 10. This device 600 may, for example, receive signals according to different mobile communication standards, such as, type 2G, 2.5G, 3G, and more recent standards. A first filter 601 may, for example, be designed to filter 850 MHz GSM signals, a second filter 602 for 900 MHz GSM signals, a third filter 603 for 1800 MHz GSM signals, and a fourth filter 604 for 1900 MHz GSM signals and a fifth filter 605 for 2.14 GHz WCDMA signals.

A signal is firstly received by the antenna 1. For example, if the received signal is an 850 MHz GSM signal, then zero control voltages are applied to the filters 602, 603, 604, and 605, thus putting these filters into the OFF state, so that the signal received can be directed only to the first filter 601 to which a non-zero control voltage is applied. The first filter 601 then filters the input signal around 850 MHz. The signal thus filtered can then be processed by a circuit 620. If the received signal is a WCDMA signal, then a zero control voltage is applied to filters 601, 602, 603, 604 and a non-zero control voltage is applied to the fifth filter 605. The principle is identical for the reception of 900 MHz, 1800 MHz or 1900 MHZ GSM signals, the appropriate filter being the only filter that is not in the OFF state.

It is also preferable that filters in the OFF state should have a satisfactory impedance so as to not short circuit the received signal. To achieve this, a matching network 611 to 615 is placed between the antenna 1 and each switchable filter 601 to 605. This special matching may, for example, be done by "quarter wave" transmission lines or circuits based on inductances and capacitances. These filters 601, 602, 603, 604 and 605 could also be used in a device for transmission of signals according to several standards, or even a device for transmission and reception of multi-standard signals.

That which is claimed is:

1. A switchable filter comprising:
   a first acoustic resonator including a plurality of first electrodes, and at least one first resonant layer between said first electrodes; and
   a second acoustic resonator including a plurality of second electrodes, and at least one second resonant layer between said second electrodes, said second acoustic resonator being acoustically coupled with said first acoustic resonator, at least one of the at least one first resonant layer and the at least one second resonant layer comprising electrostrictive material;
   at least one of said first electrodes and at least one of said second electrodes being arranged between said first resonant layer and said second resonant layer;
   the electrostrictive material adjusting a resonance and a filter switching of said first and second acoustic resonators as a function of a control voltage applied to said first and second acoustic resonators.

2. The switchable filter according to claim 1 further comprising an acoustic isolator; and wherein said first acoustic resonator is between said second acoustic resonator and said acoustic isolator.

3. The switchable filter according to claim 1 further comprising an acoustic isolator; and wherein said second acoustic resonator is between said first acoustic resonator and said acoustic isolator.

4. The switchable filter according to claim 2 further comprising a substrate; wherein said acoustic isolator is between said substrate and said first acoustic resonator.

5. The switchable filter according to claim 3 further comprising a substrate; wherein said acoustic isolator is between said substrate and said second acoustic resonator.

6. The switchable filter according to claim 2 wherein said acoustic isolator comprises an acoustic reflector.

7. The switchable filter according to claim 6 wherein said acoustic reflector comprises at least one of a Bragg mirror and an air cavity.

8. The switchable filter according to claim 1 further comprising a plurality of acoustic coupling layers between said first and second acoustic resonators for acoustically coupling said first and second acoustic resonators.

9. The switchable filter according to claim 1, further comprising:
   a third acoustic resonator including a plurality of third electrodes, and at least one third resonant layer arranged between said third electrodes;
   said third acoustic resonator being acoustically coupled with said first and second acoustic resonators;
   one of said first, second, or third acoustic resonators being arranged between said other two acoustic resonators.

10. The switchable filter according to claim 9 wherein said third resonant layer comprises electrostrictive material.

11. The switchable filter according to claim 9 further comprising a plurality of acoustic coupling layers; wherein said third acoustic resonator is acoustically coupled with at least one of said first acoustic resonator and said second acoustic resonator by said acoustic coupling layers arranged between said third acoustic resonator and said at least one of said first acoustic resonator and said second acoustic resonator.

12. The switchable filter according to claim 1 further comprising:
   a third acoustic resonator including a plurality of third electrodes, and at least one third resonant layer arranged between said third electrodes; and
   a fourth acoustic resonator including a plurality of fourth electrodes, and at least one fourth resonant layer arranged between said fourth electrodes;
   said fourth acoustic resonator being acoustically coupled with said third acoustic resonator;
   one of said third electrodes and one of said fourth electrodes being arranged through said third resonant layer and said fourth resonant layer, respectively;
   said third electrodes and said fourth electrodes being electrically connected to said first and second electrodes.

13. The switchable filter according to claim 12 further comprising a plurality of acoustic coupling layers; and wherein said third acoustic resonator is acoustically coupled with said fourth acoustic resonator through said acoustic coupling layers arranged between said third acoustic resonator and said fourth acoustic resonator.

14. The switchable filter according to claim 12 wherein at least one of said third resonant layer and said fourth resonant layer comprises electrostrictive material.

15. The switchable filter according to claim 14 wherein two electrodes from one of said first electrodes and said second electrodes are filter input electrodes, and two electrodes from one of said first electrodes and said second electrodes are filter output electrodes; and wherein at least one electrode from the filter input electrodes and the filter output electrodes is connected to a reference potential and forms at least one of an input and an output electrode of a non-differential type filter.

16. The switchable filter according to claim 14 wherein two electrodes from one of said first electrodes and said second electrodes are filter input electrodes, and two electrodes from one of said first electrodes and said second electrodes are filter output electrodes; wherein the filter input electrodes comprise differential input electrodes; and wherein the filter output electrodes comprise differential output electrodes.

17. A wireless device comprising:
a antenna;
a switchable filter coupled to said antenna and comprising
   a first acoustic resonator including a plurality of first electrodes, and at least one first resonant layer between said first electrodes; and
   a second acoustic resonator including a plurality of second electrodes, and at least one second resonant layer between said second electrodes, said second acoustic resonator being acoustically coupled with said first acoustic resonator, at least one of the at least one first resonant layer and the at least one second resonant layer comprising electrostrictive material;
   at least one of said first electrodes and at least one of said second electrodes being arranged between said first resonant layer and said second resonant layer;
   the electrostrictive material adjusting a resonance and a filter switching of said first and second acoustic resonators as a function of a control voltage applied to said first and second acoustic resonators.

18. The wireless device according to claim 17 further comprising at least one impedance matching network arranged between said switchable filter and said antenna.

19. The wireless device according to claim 17 comprising a controller for implementing at least one communication standard of 2G, 2.5G, and 3G.

20. A method of making a switchable filter comprising:
providing a first acoustic resonator including a plurality of first electrodes, and at least one first resonant layer between the first electrodes;
acoustically coupling the first acoustic resonator with a second acoustic resonator including a plurality of second electrodes, and at least one second resonant layer between the second electrodes, at least one of the at least one first resonant layer and the at least one second resonant layer comprising electrostrictive material; and
arranging at least one of the first electrodes and at least one of the second electrodes between the first resonant layer and the second resonant layer;
the electrostrictive material adjusting a resonance and a filter switching of the first and second acoustic resonators as a function of a control voltage applied to the first and second acoustic resonators.

21. The method of making the switchable filter according to claim 20 wherein two electrodes from one of the first electrodes and the second electrodes being filter input electrodes, and two electrodes from one of the first electrodes and the second electrodes being filter output electrodes.

22. The method of making the switchable filter according to claim 20 further comprising positioning the first resonator between the second acoustic resonator and an acoustic isolator.

23. The method of making the switchable filter according to claim 20 further comprising positioning the second acoustic resonator between the first acoustic resonator and an acoustic isolator.

* * * * *

UNITED STATES PATENT AND TRADEMARK OFFICE
CERTIFICATE OF CORRECTION

| | | |
|---|---|---|
| PATENT NO. | : 7,586,391 B2 | Page 1 of 1 |
| APPLICATION NO. | : 11/845362 | |
| DATED | : September 8, 2009 | |
| INVENTOR(S) | : Volatier et al. | |

It is certified that error appears in the above-identified patent and that said Letters Patent is hereby corrected as shown below:

IN THE SPECIFICATION:

| | |
|---|---|
| Column 5, Line 32 | Delete: "an" <br> Insert: --a-- |
| Column 6, Line 44 | Delete: "bands" <br> Insert: --band-- |
| Column 8, Line 24 | Delete: "1301" <br> Insert: --130,-- |
| Column 9, Line 40 | Delete: "138a" <br> Insert: --118a-- |

IN THE CLAIMS:

| | |
|---|---|
| Column 13, Line 7, Claim 17 | Delete: "a" <br> Insert: --an-- |

Signed and Sealed this

Seventh Day of September, 2010

David J. Kappos
*Director of the United States Patent and Trademark Office*